US011482423B2

(12) United States Patent
Luan et al.

(10) Patent No.: US 11,482,423 B2
(45) Date of Patent: Oct. 25, 2022

(54) PLASMA ETCHING TECHNIQUES

(71) Applicant: Tokyo Electron Limited, Tokyo (JP)

(72) Inventors: Pingshan Luan, Albany, NY (US); Aelan Mosden, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/161,199

(22) Filed: Jan. 28, 2021

(65) Prior Publication Data

US 2022/0238344 A1 Jul. 28, 2022

(51) Int. Cl.
*H01J 37/32* (2006.01)
*H01L 21/3065* (2006.01)
*H01L 21/02* (2006.01)
*H01L 21/311* (2006.01)

(52) U.S. Cl.
CPC .... *H01L 21/3065* (2013.01); *H01J 37/32449* (2013.01); *H01L 21/02381* (2013.01); *H01L 21/31116* (2013.01); *H01J 2237/3346* (2013.01)

(58) Field of Classification Search
CPC .......... H01L 21/3065; H01L 21/02381; H01L 21/31116; H01J 37/32449; H01J 2237/3346
USPC ....... 438/700, 706, 710, 711, 712, 714, 717, 438/719, 723, 736
See application file for complete search history.

(56) References Cited

U.S. PATENT DOCUMENTS

| | | | | |
|---|---|---|---|---|
| 8,389,416 B2* | 3/2013 | Luong | ................. | H01J 37/3266 438/714 |
| 9,653,291 B2* | 5/2017 | Yan | .................. | H01L 21/02538 |
| 9,881,921 B2* | 1/2018 | Czornomaz | ..... | H01L 21/823828 |
| 10,177,227 B1* | 1/2019 | Yoshida | ............ | H01L 21/67196 |
| 11,069,819 B2* | 7/2021 | Frougier | ........... | H01L 29/78618 |
| 2002/0187610 A1* | 12/2002 | Furukawa | ......... | H01L 29/78645 438/283 |
| 2015/0126039 A1 | 5/2015 | Korolik et al. | | |
| 2015/0372119 A1 | 12/2015 | Zhang et al. | | |

(Continued)

FOREIGN PATENT DOCUMENTS

JP 2013251471 A 12/2013

OTHER PUBLICATIONS

Ahles, Christopher F., et al. "Selective Etching of Silicon in Preference to Germanium and Si 0.5 Ge 0.5." ACS Applied Materials Interfaces, May 24, 2017, doi:https://doi.org/10.1021/acsami.7b02060.

(Continued)

*Primary Examiner* — Lan Vinh

(74) *Attorney, Agent, or Firm* — Slater Matsil, LLP

(57) ABSTRACT

In certain embodiments, a method for processing a semiconductor substrate includes receiving a semiconductor substrate that includes a film stack. The film stack includes first and second germanium-containing layers and a first silicon layer positioned between the first and second germanium-containing layers. The method includes selectively etching the first silicon layer by exposing the film stack to a plasma that includes fluorine agents and nitrogen agents. The plasma etches the first silicon layer, and causes a passivation layer to be formed on exposed surfaces of the first and second germanium-containing layers to inhibit etching of the first and second germanium-containing layers during exposure of the film stack to the plasma.

20 Claims, 6 Drawing Sheets

(56) References Cited

U.S. PATENT DOCUMENTS

2017/0271165 A1 9/2017 Kal et al.
2020/0266070 A1 8/2020 Voronin et al.

OTHER PUBLICATIONS

Patent Cooperation Treaty, "Notification of Transmittal of the International Search Report and the Written Opinion of the International Searching Authority, or the Declaration" and associated "International Search Report" and "Written Opinion," International Searching Authority, PCT/US2022/013558, dated May 12, 2022, 10 pages.

* cited by examiner

PLASMA ETCHING TECHNIQUES

TECHNICAL FIELD

This disclosure relates generally to semiconductor fabrication, and, in certain embodiments, to plasma etching techniques.

BACKGROUND

The integrated circuit (IC) manufacturing industry strives to increase device density to improve speed, performance, and costs. For continued scaling to smaller node sizes, device architectures have evolved from two-dimensional (2D) planar structures to three-dimensional (3D) vertical structures, such as with nanowires or vertically oriented transistors. Insufficient control of the conducting channel by the gate potential drives a desire for this change. Short channel effects (SCE) may become too significant as gate dimensions are scaled down and may increase current conduction when no voltage is applied to the gate ($I_{off}$). A change in device architecture may allow better electrostatic control of the gate to reduce the SCE and power loss. Fabricating nanowire devices may present 3D etch challenges where highly selective isotropic etch processes are beneficial. For example, layers of exposed materials may need to be etched relative to one another to create indents in a film stack.

SUMMARY

In certain embodiments, a method for processing a semiconductor substrate includes receiving a semiconductor substrate that includes a film stack. The film stack includes first and second germanium (Ge)-containing layers and a first silicon (Si) layer positioned between the first and second Ge-containing layers. The method includes selectively etching the first Si layer by exposing the film stack to a plasma that includes fluorine agents and nitrogen agents. The plasma etches the first Si layer, and causes a passivation layer to be formed on exposed surfaces of the first and second Ge-containing layers to inhibit etching of the first and second Ge-containing layers during exposure of the film stack to the plasma.

In certain embodiments, a method for processing a semiconductor substrate includes positioning a semiconductor substrate in a plasma chamber of a plasma tool. The semiconductor substrate includes a film stack that includes Si layers and Ge-containing layers in an alternating stacked arrangement, with at least two Si layers and at least two Ge-containing layers. The method includes generating, in the plasma chamber of the plasma tool, a plasma that includes fluorine agents, nitrogen agents, and hydrogen agents. The plasma is generated without a deliberate introduction of oxygen-containing gas into the plasma chamber. The method includes exposing, in the plasma chamber of the plasma tool, the film stack to the plasma. The plasma causes a nitride passivation layer to be formed on exposed surfaces of the Ge-containing layers and selectively etches opposing exposed ends of the Si layers to form indents in the Si layers relative to opposing exposed ends of the Ge-containing layers. The nitride passivation layer inhibits etching of the Ge-containing layers by the plasma.

A method for processing a semiconductor substrate includes positioning a semiconductor substrate in a plasma chamber of a plasma tool. The semiconductor substrate includes a film stack that includes first layers of a first material and second layers of a second material in an alternating stacked arrangement. The first material is Si. The method includes generating a plasma for selectively etching the first layers of the first material. Generating the plasma includes introducing gases including fluorine and nitrogen into the plasma chamber and maintaining a temperature on the semiconductor substrate of approximately −40° C. to approximately 40° C. The method includes exposing, in the plasma chamber, the film stack to the plasma for a time period. The plasma selectively etches opposing exposed ends of the first layers of the first material to form indents in the first layers of the first material relative to opposing exposed ends of the second layers of the second material.

BRIEF DESCRIPTION OF THE DRAWINGS

For a more complete understanding of this disclosure, and advantages thereof, reference is made to the following descriptions taken in conjunction with the accompanying drawings, in which.

DETAILED DESCRIPTION OF ILLUSTRATIVE EMBODIMENTS

Figure 1A:
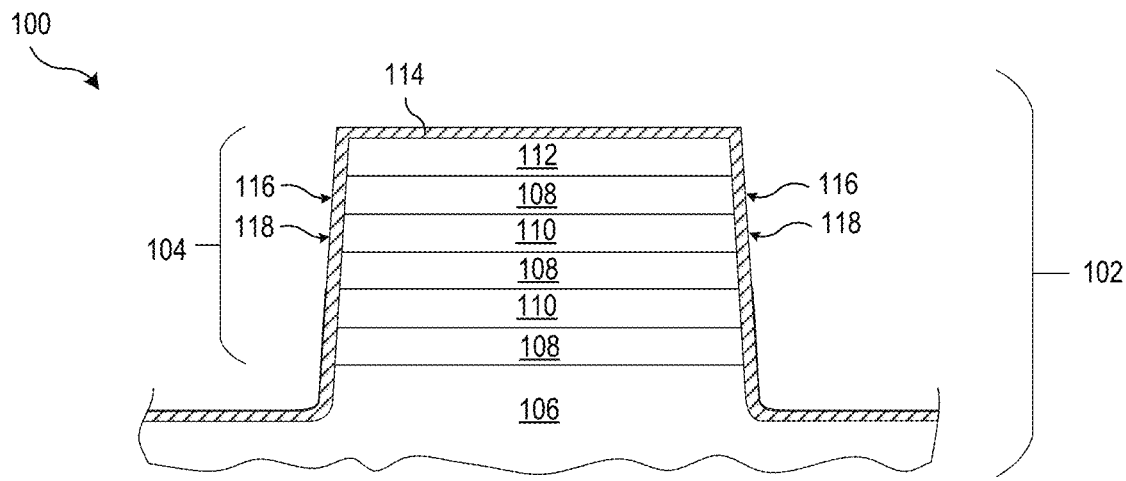
FIGS. 1A-1D illustrate cross-sectional views of an example semiconductor substrate during an example process for processing the semiconductor substrate, according to certain embodiments of this disclosure.

Various techniques for attempting to selectively etch one material relative to another exist. In some cases the chemistry of two materials is sufficiently distinct to allow a plasma that is selective to etching one of the materials to be used without concern for etching the other material. In other cases determining appropriate etching regimes for selective etching is more difficult because the chemistry of the materials may be similar or the available etching processes may be limited by other factors. Certain materials present more difficult selectivity challenges where it is desirable to etch one material with little to no etching of another material. Conventional processes for this type of selective etching may be unable to achieve selective etching of one material relative to another or may fall short of process requirements such as selectivity, etch profile (e.g., local uniformity and/or surface roughness), and others.

Selectivity challenges may arise in forming nanowires or nanosheets to act as a channel region in a 3D vertical structure of a semiconductor device, such as a gate-all-around (GAA) device. Forming such nanowires may involve forming a film stack on a base layer, the film stack including layers of Si and Ge or Si—Ge (SiGe) alloy arranged in an alternating stack. Part of this process may include etching indents in the film stack at opposing ends of the Si layers, while minimizing etching of the Ge-containing layers, to expose end portions of the Ge-containing layers for later use as a conducting device. Due to various challenges, including in part a native oxide layer (NOL) and/or other residues (e.g., reactive ion etching (RIE) residue) present on surfaces of the film stack, conventional etching techniques may be unsatisfactory.

For example, some conventional techniques employ a single etch step using a plasma of nitrogen trifluoride ($NF_3$) (or another etchant) and oxygen ($O_2$). Fluorine radicals in this plasma may etch the Si layers, while the oxygen may react with the Ge in the Ge-containing layers to form a Ge oxide (e.g., $GeO_2$) protection layer on the Ge-containing layers. Post-etch, however, resulting structures generally show unacceptable levels of surface roughness along exposed surfaces of the Si layers and the Ge-containing layers, resulting in part from the etching of the NOL. Furthermore, although the $GeO_2$ protection layer may facilitate selectively etching the Si layers, the $GeO_2$ layer consumes a significant portion of the Ge-containing layers.

As another example, prior to performing the plasma etch to form indents in the film stack, some conventional techniques use a wet or dry process to remove the NOL. The film stack may be processed using a dilute hydrogen-fluoride (HF) acid or a chemical oxide removal process. Removing the NOL over surfaces of both the Si layers and the Ge-containing layers, however, may reduce the selectivity of the subsequent indent plasma etch process (e.g., using $NF_3$ and $O_2$) to etch the Si layers with minimal to no etching of the Ge-containing layers.

Embodiments provided below describe various methods of selective etching. For example, embodiments may be used to selectively etch portions of a film stack (e.g., that includes Si layers and Ge-containing layers in an alternating stacked arrangement) of a substrate. It may be desirable to selectively etch indents in edge portions of (or possibly completely remove) the Si layers to form nanowires of the Ge-containing layers.

Certain embodiments use oxygen-free plasma to form indented regions, or recesses, in a film stack that includes Si layers and Ge-containing layers in an alternating stacked arrangement. The oxygen-free plasma may cause a passivation layer (e.g., a Ge-nitride passivation layer) to be formed on exposed surfaces of the Ge-containing layers. Prior to exposing the substrate to the oxygen-free plasma, a barrier layer (e.g., an NOL) may be substantially removed from exposed surfaces of the film stack using a suitable dry or wet etch process.

FIGS. 1A-1D illustrate cross-sectional views of an example substrate 102 during an example process 100 for processing substrate 102, according to certain embodiments of this disclosure. In certain embodiments, process 100 incorporates an oxygen-free plasma etch process to etch portions of certain layers of a film stack of substrate 102, resulting in substrate 102 having an indented film stack following execution of process 100. It should be understood that oxygen-free does not necessarily mean that all oxygen is eliminated from process 100, but instead reflects that oxygen-containing gas, such as $O_2$ and $CO_2$, is not deliberately introduced as part of the plasma etch process.

As illustrated in FIG. 1A, substrate 102 is a semiconductor substrate that includes film stack 104 disposed on a base layer 106. Film stack 104 includes Si layers 108 and Ge-containing layers 110 in an alternating stacked arrangement. Film stack 104 may have any suitable shape and include any suitable number of layers. As examples, the vertical thickness of Si layers 108 and Ge-containing layers 110 may be about 10 nm to about 25 nm each, and as particular examples may be about 10 nm or about 20 nm. Additionally, Si layers 108 may have the same thicknesses or may vary in thickness relative to one another, Ge-containing layers 110 may have the same thickness or may vary in thickness relative to one another, and Si layers 108 and Ge-containing layers 110 may have the same thicknesses or may vary in thickness relative to one another. In a particular example, Si layers 108 and Ge-containing layers 110 all have substantially the same thicknesses.

The material of Si layers 108 may be pure Si or Si nitride (SiN), for example. In certain embodiments, all Si layers 108 include the same material; however, Si layers 108 may include different materials if desired.

The material of Ge-containing layers 110 may be pure Ge or SiGe alloy, for example. As a particular example, the Ge-containing layers 110 may include a SiGe alloy (mixture) in an appropriate ratio (e.g., $Si_{0.7}Ge_{0.3}$, $Si_{0.75}Ge_{0.25}$, etc.) for desired etching properties of a given application or for desired performance in a resulting semiconductor device formed using, in part, process 100. In certain embodiments, all Ge-containing layers 110 include the same materials; however, Ge-containing layers 110 may include different materials if desired.

Base layer 106 may be any suitable material and includes Ge or SiGe alloy in one example. In a particular example, film stack 104 is formed by growing alternating heteroepitaxial layers of Si (e.g., Si layers 108) and Ge or SiGe (e.g., Ge-containing layers 110) atop base layer 106.

An optional hard mask 112 may be included on top of film stack 104. Hard mask 112 may have been used to form the structure of film stack 104, in a previous etch process for example. In certain embodiments, hard mask 112 is SiN but may include any suitable material.

A barrier layer 114 is formed over film stack 104 (including hard mask 112) and, in this example, base layer 106. Barrier layer 114 may result from prior fabrication steps (e.g., RIE) applied to substrate 102 or from other handling of substrate 102 (e.g., exposure to ambient air when transferring between processing tools). As particular examples, barrier layer 114 may include an NOL, RIE residue, or both. An NOL may be a thin layer of $SiO_2$ (or other suitable material), about 1 nm to about 2.0 nm thick for example, that forms on surfaces of substrate 102, such as when substrate 102 is exposed to ambient air, which contains $O_2$ and $H_2O$. For example, surfaces of base layer 106, Si layers 108, Ge-containing layers 110, and hard mask 112 may interact with the ambient air, which may result in barrier layer 114 at those surfaces. As another example, surfaces of base layer 106, Si layers 108, Ge-containing layers 110, and hard mask 112 may include a residue resulting from prior RIE steps.

Barrier layer 114 may have different etch properties than layers that underlie barrier layer 114. Although shown as having generally uniform coverage over film stack 104 (including hard mask 112) and base layer 106, barrier layer 114 might or might not have uniform coverage.

Each of the layers in film stack 104 has a pair of exposed surfaces at opposed ends when viewed, as illustrated, from a cross-sectional perspective. That is, each of Si layers 108 has (opposing) exposed surfaces 116, and each of Ge-containing layers 110 has (opposing) exposed surfaces 118. Additionally, in the state illustrated in FIG. 1A, because substrate 102 includes barrier layer 114, exposed surfaces of 116 of Si layers 108 and exposed surfaces 118 of Ge-containing layers 110 include barrier layer 114.

Figure 1B:
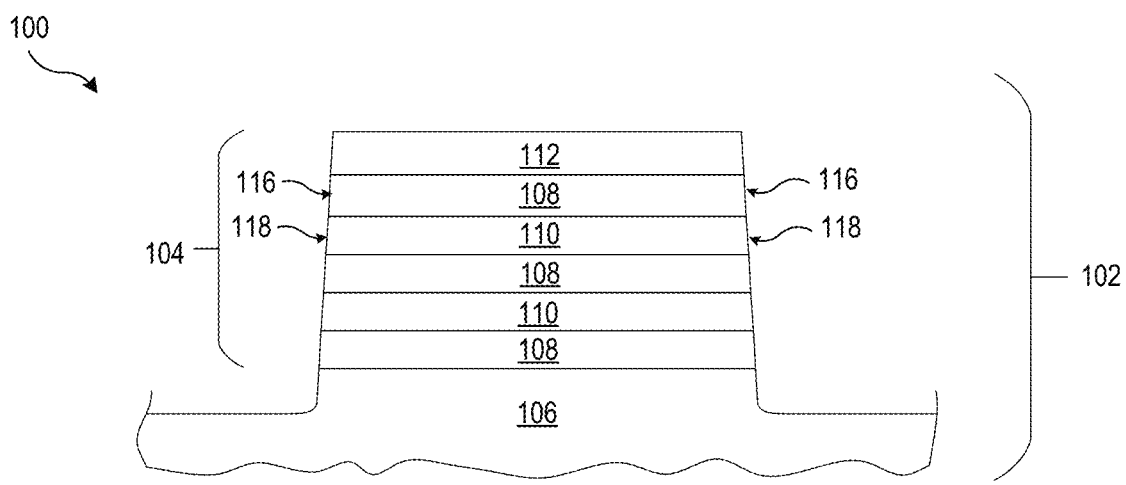

As illustrated in FIG. 1B, barrier layer 114 is etched to remove some or all of barrier layer 114 from exposed surfaces 116 of Si layers 108, from exposed surfaces 118 of Ge-containing layers 110, and from exposed surfaces of base layer 106 and hard mask 112. Barrier layer 114 may be removed using any suitable process, including any suitable wet etch or dry etch process. In certain embodiments, substrate 102 is processed using a dilute HF acid or a chemical oxide removal process to remove some or all of barrier layer 114. The process used to etch barrier layer 114 might or might not remove some or all of hard mask 112, but for purposes of this example, hard mask 112 is shown not to be removed or otherwise etched. Removing barrier layer 114 from exposed surfaces 116 of Si layers 108 and from exposed surfaces 118 of Ge-containing layers 110, however, may reduce the selectivity of a subsequent conventional oxygen-based indent plasma etch process (e.g., using $NF_3$ and $O_2$) to attempt to etch Si layers 108 with minimal to no etching of Ge-containing layers 110.

Figure 1C:
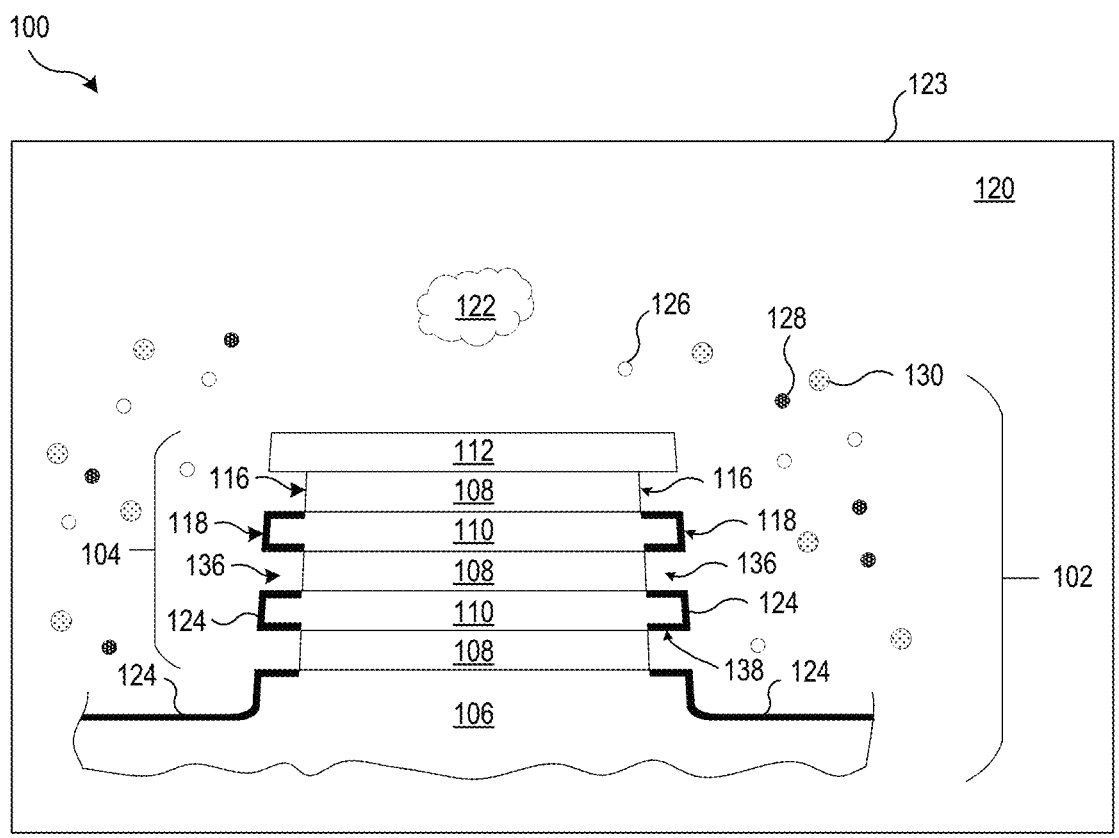

As illustrated in FIG. 1C, in a plasma step 120 of process 100, substrate 102 is exposed to plasma 122 to selectively etch Si layers 108. For example, substrate 102 may be exposed to plasma 122, which is an oxygen-free plasma, to selectively etch exposed surfaces 116 of Si layers 108 to form indents 136 in film stack 104, with opposing end portions of Si layers 108 in an intermediate state of removal/etching relative to adjacent Ge-containing layers 110. In certain embodiments, plasma step 120 is an isotropic etch process.

Plasma step 120 may be performed in plasma chamber 123 of a plasma tool. The plasma tool may be any suitable type of plasma tool, including an inductively-coupled plasma (ICP) tool, a capacitively-coupled plasma (CCP) tool, a surface wave plasma (SWP) tool, and others. One example plasma tool is described below with reference to FIG. 5.

In certain embodiments, plasma step 120 is an oxygen-free plasma etch process to etch portions of certain layers of a film stack of substrate 102, resulting in substrate 102 having an indented, or recessed, film stack following execution of process 100. It should be understood that oxygen-free does not necessarily mean that all oxygen is eliminated from plasma step 120, but instead reflects that oxygen-containing gas is not deliberately introduced as part of plasma step 120. Removing all oxygen from a plasma chamber 123 may be difficult or impossible, so some oxygen may still be present during certain steps described below.

During exposure of substrate 102 to plasma 122 and to facilitate selective etching of Si layers 108, plasma 122 may cause a passivation layer 124 to be formed on exposed surfaces 118 of Ge-containing layers 110. Plasma 122 may cause passivation layer 124 to form on exposed surfaces 118 of Ge-containing layers 110 by removing and replacing or otherwise modifying portions of Ge-containing layers 110 at exposed surfaces 118 of Ge-containing layers 110. In certain embodiments, passivation layer 124 also may be formed on exposed surfaces of base layer 106, such as when base layer 106 is pure Ge or includes Ge (e.g., a SiGe base layer 106).

During exposure of substrate 102 to plasma 122, passivation layer 124 on exposed surfaces 118 of Ge-containing layers 110 (and, in the illustrated example, on exposed surfaces of base layer 106) inhibits etching of Ge-containing layers 110 (and, in the illustrated example, of base layer 106). In other words, plasma 122 selectively etches Si layers 108 due at least in part to the formation and presence of passivation layer 124 on exposed surfaces 118 of Ge-containing layers 110 (and on exposed surfaces of base layer 106).

Although passivation layer 124 may have any suitable thickness, in certain embodiments, passivation layer is relatively thin, such as 2 nm or less. Passivation layer 124 could be, for example, a monolayer. In certain embodiments, passivation layer 124 is a nitride, such as Ge nitride (e.g., $Ge_3N_4$).

As plasma 122 etches Si layers 108, additional surfaces 138 of Ge-containing layers 110 are exposed. That is, indents 136, or recesses, are formed in film stack 104 due to the selective etching of Si layers 108, additional surfaces 138 of Ge-containing layers 110 are exposed. Plasma 122 may continue to form passivation layer 124 on additional surfaces 138. Passivation layer 124 formed on additional surfaces 138 also may be a nitride, such as Ge nitride (e.g., $Ge_3N_4$). In other words, passivation layer 124 is further formed over newly exposed surfaces (e.g., additional surfaces 138) of Ge-containing layers 110 as Si layers 108 are etched above, below, and/or between Ge-containing layers 110. Passivation layer 124 on additional surfaces 138 inhibits etching of Ge-containing layers 110 at additional surfaces 138, while passivation layer 124 at exposed surfaces 118 of Ge-containing layers 110 inhibits etching of Ge-containing layers 110 at exposed surfaces 118.

Plasma 122 may include fluorine agents 126, hydrogen agents 128, and nitrogen agents 130. Fluorine agents 126 may act primarily as the etchant for etching Si layers 108 at exposed surfaces 116 of Si layers 108. Hydrogen agents 128 may act as a reducing agent, facilitating the etching of Si layers 108 at exposed surfaces 116 of Si layers 108 in the presence of fluorine agents 126. Furthermore, if applicable depending on the gases used to generate plasma 122, hydrogen agents 128 may further break down certain compounds of fluorine and nitrogen to produce fluorine agents 126 and nitrogen agents 130. Nitrogen agents 130 react with the Ge at exposed surfaces 118 of Ge-containing layers 110 to form a nitride layer (e.g., a Ge nitride layer, such as $Ge_3N_4$) at exposed surfaces 118. For example, the atomic nitrogen (N) generated in plasma 122 may react with the Ge molecules at exposed surfaces 118 of Ge-containing layers 110 (and exposed surfaces of base layer 106) to form a passivation layer 124 (e.g., a nitride layer) on exposed surfaces 116 of Ge-containing layers 110 (and on exposed surfaces of base layer 106).

In certain embodiments, plasma 122 may be generated from gases that include fluorine gas, nitrogen gas, and hydrogen gas. As a few examples, a fluorine-containing gas that is used to generate plasma 122 may include $NF_3$, sulfur hexafluoride ($SF_6$), or carbon tetrafluoride ($CF_4$). Furthermore, although fluorine is described, other halogens may be used to facilitate the etching process.

In certain embodiment, no oxygen-containing gas is deliberately introduced as part of the gases from which plasma 122 is generated. As a particular example, the gases used to generate plasma 122 may include a suitable combination of $NF_3$, $N_2$, and $H_2$. As another particular example, the gases may include $NF_3$, ammonia ($NH_3$), and $N_2$. In certain embodiments, the $N_2$ could be replaced by a noble gas, such as argon (Ar) or krypton (Kr), or such a noble gas may be used in combination with $N_2$. As particular examples, gases/gas combinations used to generate plasma 122 may include $N_2/H_2/NF_3$, $N_2/NH_3/NF_3$, $Ar/NH_3/NF_3$, $N_2/H_2/Ar/NF_3$, $NF_3/NH_3$, $NF_3/H_2$, or $N_2/H_2/NH_3/NF_3$.

When exposing Si layers 108 and Ge-containing layers 110 to a plasma (e.g., plasma 122) that includes fluorine agents 126 and nitrogen agents 130 (and possibly hydrogen agents 128), fluorine agents 126 may react with Si (e.g., at exposed surfaces 116 of Si layers 108) faster than hydrogen agents 128 or nitrogen agents 130 react with Si, resulting in etching of Si layers 108. Furthermore, although fluorine agents 126 are generally considered to be more reactive than hydrogen agents 128 or nitrogen agents 130, when exposing Ge-containing layers 110 to plasma 122 that includes fluorine agents 126 and nitrogen agents 130 (and possibly hydrogen agents 128), hydrogen agents 128 and/or nitrogen agents 130 may react more quickly with Ge (e.g., at exposed surfaces 118 and additional surfaces 138 of Ge-containing layers 110) than fluorine agents 126 react with Ge, forming passivation layer 124 (e.g., Ge nitride). Furthermore, because the reaction of hydrogen agents 128 and/or nitrogen agents 130 with Ge is in large part responsible for the formation of passivation layer 124 on exposed surfaces 118 and additional surfaces 138 of Ge-containing layers 110, higher concentrations of Ge in Ge-containing layers 110 may increase the likelihood that passivation layer 124 will form on exposed surfaces 118 and additional surfaces 138 of Ge-containing layers 110.

In an example in which the gases used to generate plasma 122 include $NF_3$ and $N_2$, the ratio of $NF_3$ to $N_2$ may be an appropriate consideration. In certain embodiments, plasma 122 includes more nitrogen than fluorine to ensure that passivation layer 124 is formed sufficiently quickly to reduce or eliminate etching of Ge-containing layers 110 by the fluorine and because the fluorine is the more reactive chemistry in plasma 122. The appropriate ratio (or range of ratios) may depend on a variety of factors, including other process parameters and the concentration of Ge in Ge-containing layers 110. In certain embodiments, higher percentages of Ge in Ge-containing layers 110 may result in a more-quickly formed passivation layer 124 and lead to better results. $H_2$ may be added to help drive the reactions occurring in plasma chamber 123, including etching of Si layers 108 and formation of passivation layer 124 on exposed surfaces 118 and additional surfaces 138 of Ge-containing layers 110. Example ranges for the ratio of $NF_3$ to $H_2$ may include from $NF_3:H_2=1:1.5$ to $NF_3:H_2=1:3$. Example ranges for the ratio of $NF_3$ to $N_2$ may include from $NF_3:N_2=1:2.5$ to $NF_3:N_2=1:10$.

Other process parameters for generating plasma 122 include gas flow rates, pressure, plasma source power, plasma bias power, time, and temperature. The gases for forming plasma 122 may be provided at any suitable flow rate. In certain embodiments, the etchant source gas flow rate is $NF_3$=20-50 sccm, $H_2$=30-150 sccm, $N_2$=50-500 sccm. In certain embodiments, plasma step 120 may be performed at intermediate pressure (e.g., about 100 mTorr to about 500 mTorr, and in one example about 300 mTorr to about 350 mTorr) and at intermediate source power (e.g., about 100 W to about 400 W, and in one example about 200 W to about 300 W). Exposure time for plasma step 120 may be any suitable time. In certain embodiments, exposure time could be as little as about five seconds or less, ten seconds or less, fifteen seconds or less, or twenty seconds or less. In a particular embodiment, exposure time is about fifteen seconds. In certain embodiments, plasma step 120 is performed at a temperature of approximately −40° C. to approximately 20° C., and in one example at about 0° C. It should be understood that particular values and ranges provided herein are for example purposes only.

One example recipe for the oxygen-free etch process 120 includes the following: pressure 350 mtorr; source power (inductively coupled plasma) 300 W; bias power 0 W; wafer processing temperature 0° C.; and $NF_3$, $H_2$, and $N_2$ flow rates of 30 sccm, 55 sccm, and 250 sccm, respectively. Another example recipe may include: pressure 300 mtorr; source power (inductively coupled plasma) 300 W; bias power 0 W; wafer processing temperature 0° C.; and $NF_3$, $H_2$, and $N_2$ flow rates of 20 sccm, 36 sccm, and 250 sccm, respectively.

Figure 1D:
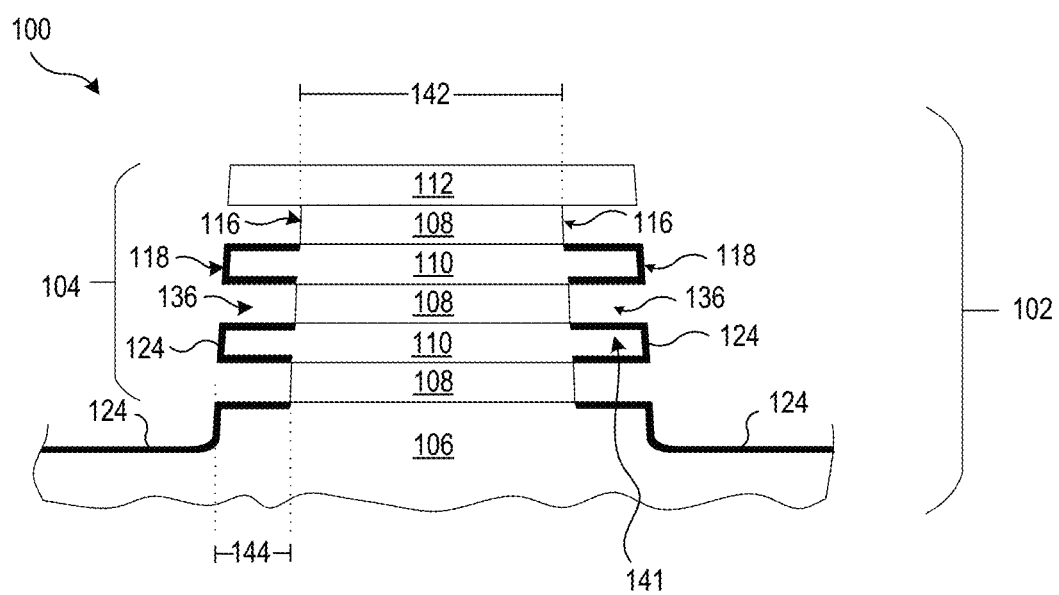

FIG. 1D illustrates substrate 102 following plasma step 120. In the state illustrated in FIG. 1D, film stack 104 includes indents 136 (of which two examples are labeled). Furthermore, due to the formation of indents 136, exposed ends 141 (of which one example is labeled) of Ge-containing layers 110 may be formed.

FIG. 1D shows certain measurements of resulting substrate 102, such as exposed end separation 142 and etched width 144. For example, exposed end separation 142 shows the remaining width (per this cross-section) of Si layers 108 by measuring each Si layer 108 from a first exposed surface 116 on a first side of film stack 104 to an opposing second exposed surface 116 on a second side of film stack 104. Exposed end separation 142 may be less than 20 nm in certain embodiments, and between 2 nm and 20 nm in one embodiment. The exposed end separation may also refer to the separation of exposed ends prior to etching. Etched width 144 may measure how much of a particular Si layer 108 was removed from a particular end of the particular Si layer 108. In other words, etched width 144 may measure the amount of an indent 136 of a Si layer 108. In certain embodiments, etched width 144 is about 5 nm to about 15 nm. However, exposed end separation 142 and etched width 144 may be outside these ranges depending on a given application.

Subsequent processing may then be performed on substrate 102. For example, plasma step 120 may be integrated into a process for forming Ge-containing layers 110 into respective nanowires for a channel region of a semiconductor device, such as a GAA device. In such a device, subsequent processing may include filling the indents 136 with an insulator, removing remaining portions of Si layers 108, providing a gate oxide around Ge-containing layers 110, and other associated steps, all of which are provided for example purposes only. In such a device, exposed ends 141 of Ge-containing layers 110 may serve as conductive contacts to a channel region formed in the area of film stack 104.

Process 100 may provide one or more technical advantages. Conventional techniques for etching Si layers selective to Ge-containing layers use a plasma chemistry that includes an etchant (e.g., fluorine) and oxygen (e.g., $NF_3/O_2$ or $CF_4/O_2$) (F/O-based plasmas, for short). Such F/O-based plasmas may oxidize surfaces of Ge-containing layers to form a Ge dioxide ($GeO_2$) or Ge oxynitride ($GeO_xN_y$) etch stop layer on the Ge-containing layers. While this etch stop layer inhibits the ability of the etchant to etch the Ge-containing layers, this etch stop layer may be thick and thereby replace a significant portion of the Ge-containing layers, reducing the thickness of the Ge-containing layers by an undesirable amount. As device sizes shrink, this loss can become a significant percentage of the Ge-containing layers (and ultimately the nanowires/nanosheet) of a channel region. Additionally, the time for this etch stop layer to form may allow the etchant to attack regions where the etch stop layer has not yet formed. Furthermore, an oxide etch stop layer may be water soluble.

Additionally, an F/O-based plasma may etch other materials on a semiconductor substrate, such as Si dioxide ($SiO_2$), Si nitride ($Si_3N_4$), oxides, and low-k dielectric materials, which may be undesirable. In other words, such oxygen-containing plasmas (e.g., F/O-based plasmas) are not selective to $SiO_2$, $Si_3N_4$, oxides, and low-k dielectric materials.

According to embodiments of process 100, passivation layer 124 formed on Ge-containing layers 110 may include a nitride (e.g., Ge nitride), which is thinner than an etch stop layer formed from oxidizing Ge-containing layers according to conventional techniques. In certain embodiments, selectively etching Si layers 108 by exposing substrate 102 (including film stack 104) to plasma 122 reduces a thickness of Ge-containing layers 110 by less than about 2.0 nm. Thus, process 100 may reduce loss of Ge-containing layers 110 during selective etching of Si layers 108 than would be caused using conventional techniques.

Additionally, due at least in part to the high-selectivity of plasma 122 to Ge-containing layers 110, which itself is due at least in part to the rapid formation of passivation layer 124 on exposed surfaces 118 and additional surfaces 138 of Ge-containing layers 118, film stack 104 may have an improved etch profile. The improved etch profile may include reduced surface roughness along surfaces 116 of Si layers 108 (to the extent Si layers 108 are not completely removed) and, in particular, along exposed surfaces 118 and remaining surfaces 138 of Ge-containing layers following plasma step 120. Additionally or alternatively, the improved etch profile may include sharp edges and square-shaped profile of exposed ends 141 of Ge-containing layers following plasma step 120. In certain embodiments, plasma process 120, including the use of plasma 122 provides a relatively straight Si etch front along surfaces 116 of Si layers 108 (to the extent Si layers 108 are not completely removed) and good local uniformity regarding the amount of Si removed from each Si layer 108 of film stack 104.

The nitride (e.g., Ge nitride) passivation layer 124 may be insoluble in water, allowing passivation layer 124 to act as an $O_2$ and $H_2O$ diffusion barrier and thereby improve the stability of the nanowire formed from the Ge-containing layer 110. In addition to being selective to Ge and SiGe, plasma 122 (e.g., a fluorine-, hydrogen- and nitrogen-containing plasma) also may be selective to $SiO_2$, $Si_3N_4$, oxides, and low-k dielectric materials, as plasma 122 lacks the oxygen that causes conventional F/O-based plasmas to etch these materials. Furthermore, removing barrier layer 114 prior to the indent etch may reduce surface roughness, but in addition, plasma 122 also has improved selectivity to etch Si layers 108 relative to Ge-containing layers 110 due to the increased speed with which passivation layer 124 is formed relative to an oxide etch stop layer.

Figure 2:
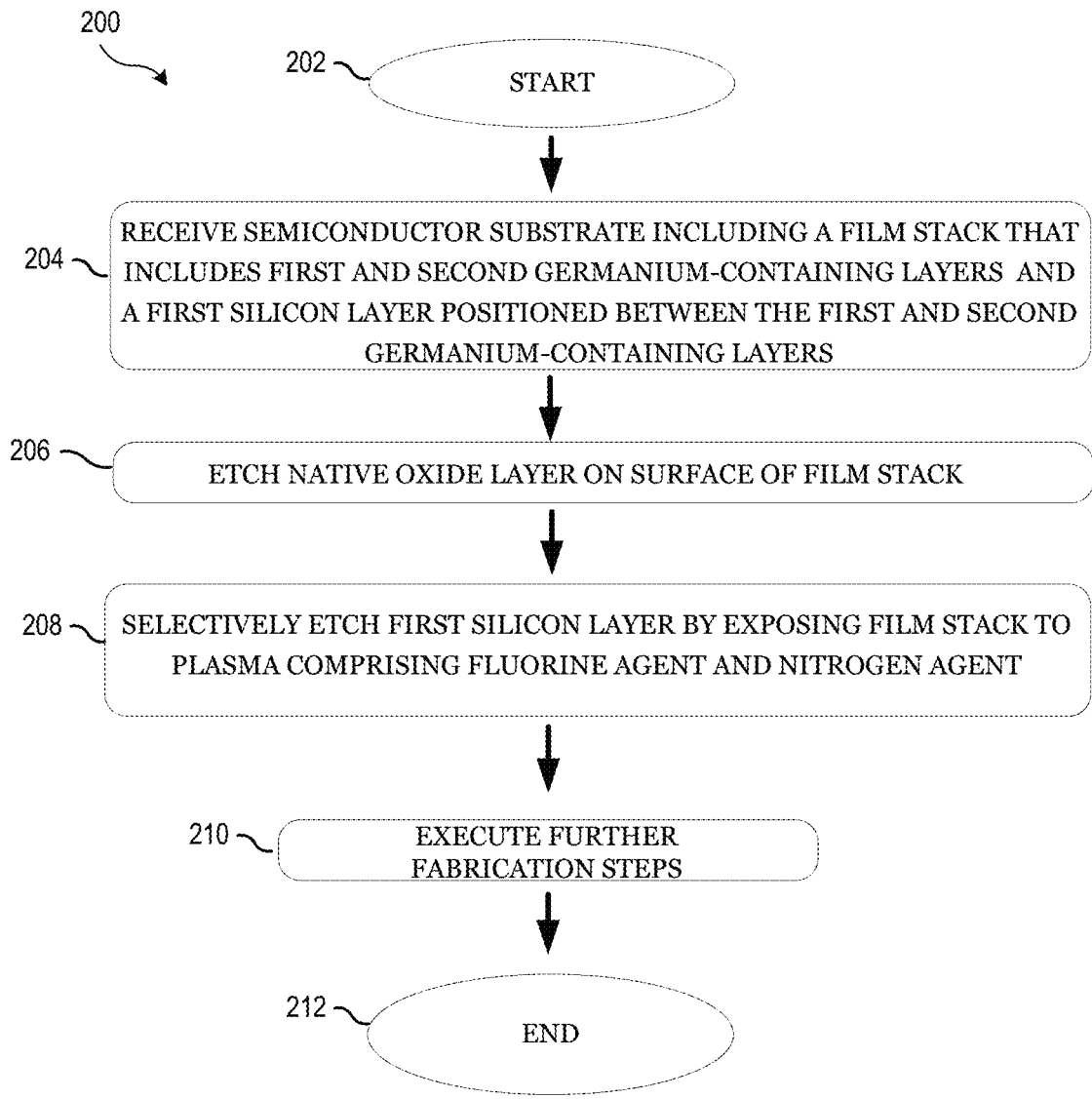
FIG. 2 illustrates an example method for processing a semiconductor substrate, according to certain embodiments of this disclosure.

FIG. 2 illustrates an example method 200 for processing substrate 102, according to certain embodiments of this disclosure. Method 200 begins at step 202. At step 204, substrate 102 is received. Substrate 102 has film stack 104 that includes Si layers 108 and Ge-containing layers 110 in an alternating stacked arrangement. That is, film stack 104 may include alternating Si layers 108 and Ge-containing layers 110 (e.g., as illustrated in FIG. 1A). Barrier layer 114 (e.g., an NOL) may be present on surfaces of film stack 104, such as on exposed surfaces 116 of Si layers 108, exposed surfaces 118 of Ge-containing layers 110, and exposed surfaces of base layer 106 and hard mask 112.

At step 206, barrier layer 114 on surfaces of film stack 104 is etched to remove barrier layer 114, from exposed surfaces 116 of Si layers 108, from exposed surfaces 118 of Ge-containing layers 110, and from exposed surfaces of base layer 106 and hard mask 112, for example. Barrier layer 114 may be removed using any suitable process, (e.g., a wet etch or dry etch process.

At step 208, Si layers 108 are selectively etched by exposing substrate 102 (including film stack 104) to plasma 122. Plasma 122 may include fluorine agents 126 and nitrogen agents 130. In certain embodiments, plasma 122 further includes hydrogen agents 128. Plasma 122 etches Si layers 108 and causes passivation layer 124 to be formed on exposed surfaces 118 of Ge-containing layers 110 to inhibit etching of Ge-containing layers 110 during exposure of semiconductor device 102 (including film stack 104) to plasma 122. In certain embodiments, step 208 is an isotropic etch process.

In certain embodiments, plasma 122 is generated from gases that include $NF_3$ gas, and fluorine agents 126 include fluorine disassociated from the $NF_3$ gas. In certain embodiments, plasma 122 is generated from gases that include $N_2$ gas, and nitrogen agents 130 include nitrogen. As particular examples, plasma 122 is generated from a gas combination that includes $NF_3$ and $NH_3$; $NF_3$, $NH_3$, and $N_2$; $NF_3$, $NH_3$, and Ar; $NF_3$ and $H_2$; $NF_3$, $H_2$, and $N_2$; or $NF_3$, $H_2$, $NH_3$, and $N_2$. In certain embodiments, passivation layer 124 formed on exposed surfaces 118 of Ge-containing layers 110 includes Ge nitride ($Ge_3N_4$).

Selectively etching Si layers 108 may include selectively etching end portions of Si layers 108 to form indent 136 in film stack 104 above, below, or between Ge-containing layers 110. As Si layers 108 are selectively etched, additional surfaces 138 of Ge-containing layers 110 are exposed, and plasma 122 forms passivation layer 124 on additional surfaces 138. In certain embodiments, selectively etching Si layer 108 includes selectively removing substantially all of Si layers 108 such that Ge-containing layers 110 are released. In certain embodiments, selectively etching Si layers 108 by exposing substrate 102 (including film stack 104) to plasma 122 reduces a thickness of Ge-containing layers 110 by less than about 2.0 nm.

At step 210, additional fabrication steps are executed. The discussion of potential additional processing steps described above with reference to FIG. 1D is incorporated by reference. For example, in certain embodiments, step 208 is integrated into a process for forming Ge-containing layers 110 into respective nanowires for a channel region of a semiconductor device, such as a GAA device. At step 212, the method ends.

Figure 3:
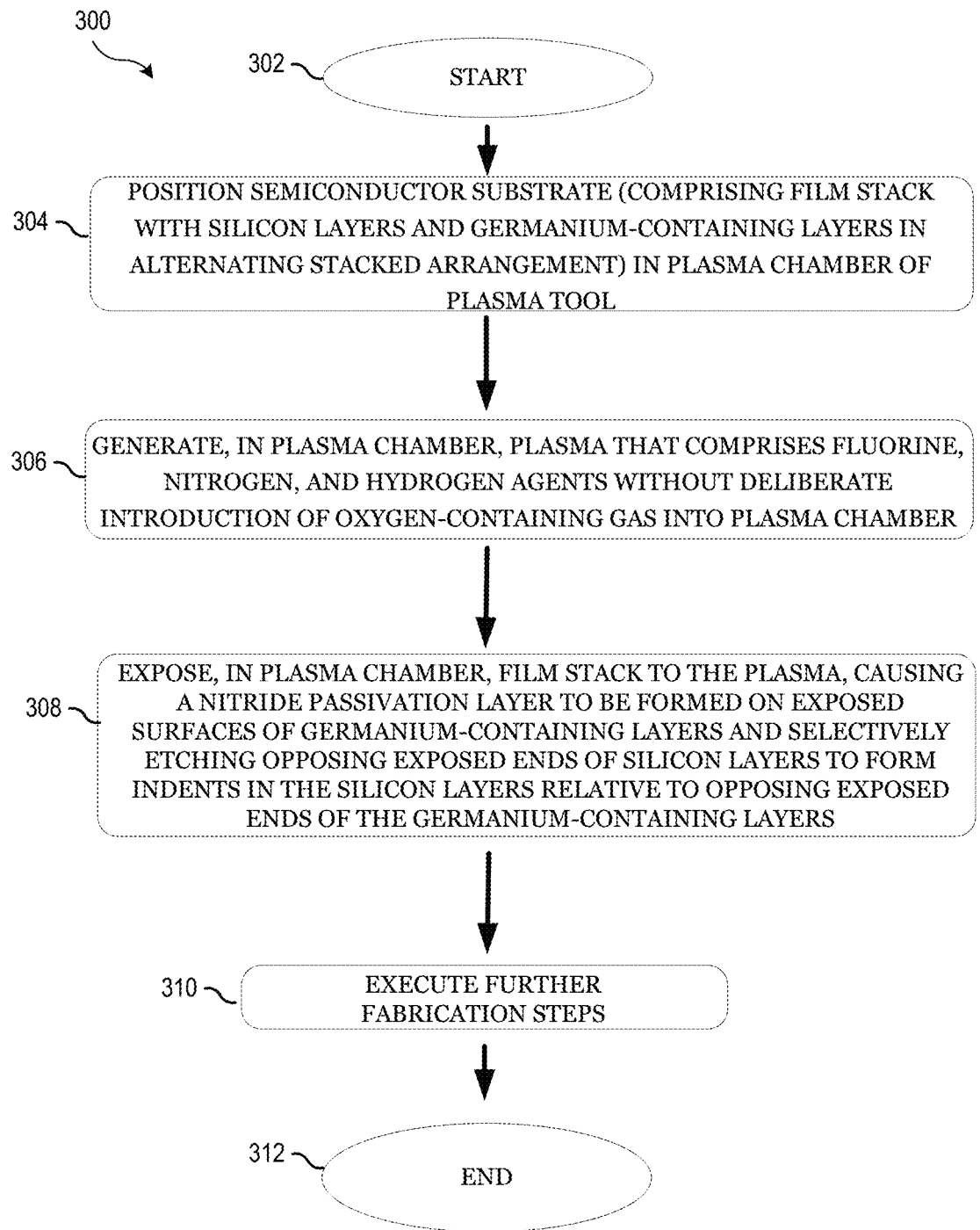
FIG. 3 illustrates an example method for processing a semiconductor substrate, according to certain embodiments of this disclosure.

FIG. 3 illustrates an example method 300 for processing substrate 102, according to certain embodiments of this disclosure. Method 300 begins at step 302. A step 304, substrate 102 is positioned in plasma chamber 123 of a plasma tool. Substrate 102 has film stack 104 that includes Si layers 108 and Ge-containing layers 110 in an alternating stacked arrangement (e.g., as shown in FIG. 1A).

At step 306, plasma 122 is generated in plasma chamber 123 of the plasma tool. Plasma 122 includes fluorine agents 126, nitrogen agents 130, and hydrogen agents 128. Plasma 122 may be generated without a deliberate introduction of oxygen-containing gas into plasma chamber 123. Plasma 122 may be generated from gases that include a fluorine-containing gas, such as $NF_3$, $SF_6$, or $CF_4$. Fluorine agents 126 may include fluorine disassociated from the fluorine-containing gas. In certain embodiments, plasma 122 is generated from gases that include a nitrogen-containing gas, and the nitrogen-containing gas includes NH, $NH_2$, or $NH_3$, and nitrogen agents 130 include nitrogen disassociated from the nitrogen-containing gas.

In certain embodiments, plasma 122 is generated from gases that include $N_2$ gas and $H_2$ gas, nitrogen agents 130 including nitrogen and hydrogen agents 128 including hydrogen. As particular examples, plasma 122 may be generated from a gas combination that includes $NF_3$ and $NH_3$; $NF_3$, $NH_3$, and $N_2$; $NF_3$, $NH_3$, and Ar; $NF_3$ and $H_2$; $NF_3$, $H_2$, and $N_2$; or $NF_3$, $H_2$, $NH_3$, and $N_2$.

At step 308, substrate 102 (including film stack 104) is exposed to plasma 122 in plasma chamber 123. Plasma 122 causes passivation layer 124, which may be a nitride layer, to be formed on exposed surfaces 118 and additional surfaces 138 of Ge-containing layers 110. In certain embodiments, passivation layer 124 includes Ge nitride ($Ge_3N_4$). Plasma 122 also selectively etches exposed surfaces 116 (e.g., opposing exposed ends) of Si layers 108 to form indents 136 in Si layers 108 relative to exposed surfaces 118 (e.g., opposing exposed ends) of Ge-containing layers 110. Passivation layer 124 inhibits etching of Ge-containing layers 110 by plasma 122. In certain embodiments, step 308 is an isotropic etch process.

At step 310, additional fabrication steps are executed. The discussion of potential additional processing steps described above with reference to step 210 of FIG. 2 is incorporated by reference. At step 312, the method ends.

Figure 4:
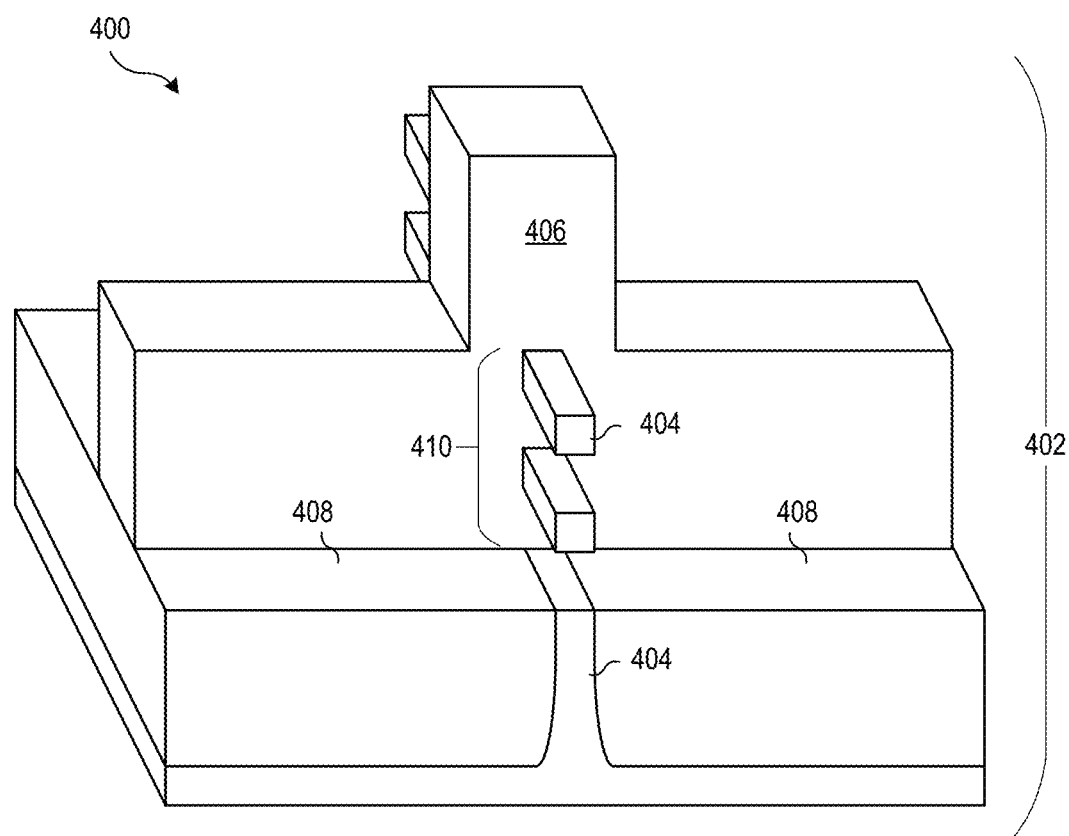
FIG. 4 illustrates an example device including a substrate with a recessed alternating film stack, according to certain embodiments of this disclosure.

FIG. 4 illustrates an example device 400 including a substrate with a recessed alternating film stack according to certain embodiments of this disclosure. At least a portion of device 400 may be formed using any of the processes and methods as described herein.

Device 400 includes a substrate 402 that includes a channel material 404 (e.g., Ge or SiGe) and a gate material 406, (e.g. SiGe or Si). Channel material 404 may correspond to Ge-containing layers 110 of substrate 102, at some point after process 100. Device 400 may be a GAA device as shown here or may be any other device, such as a fin field-effect transistor (FinFET). Device 400 also may include isolation regions 408. In certain embodiments, isolation regions 408 are shallow trench isolations (STIs).

Device 400 may be fabricated by first forming a recessed alternating film stack 410 (which may correspond to film stack 104 following process 100, possibly with additional subsequent processes) and then depositing additional gate material 406 over recessed alternating film stack 410. Specifically, device 400 may be formed by heteroepitaxial growth of alternating Si and Ge or SiGe layers which are then patterned and recessed vertically to expose the Ge or SiGe layers laterally.

The application of embodiments described herein may advantageously be an optimal solution for the 5 nm node, 3 nm node, or lower. For example, the GAA device architecture may be suitable for scaling beyond the 7 nm node. The GAA device architecture may address short channel effects found in some FinFET architectures by wrapping the gate around the entire channel instead of only three sides. This could reduce or eliminate current leakage occurring under the gate of the FinFET, therefore reducing non-active power losses.

Figure 5:
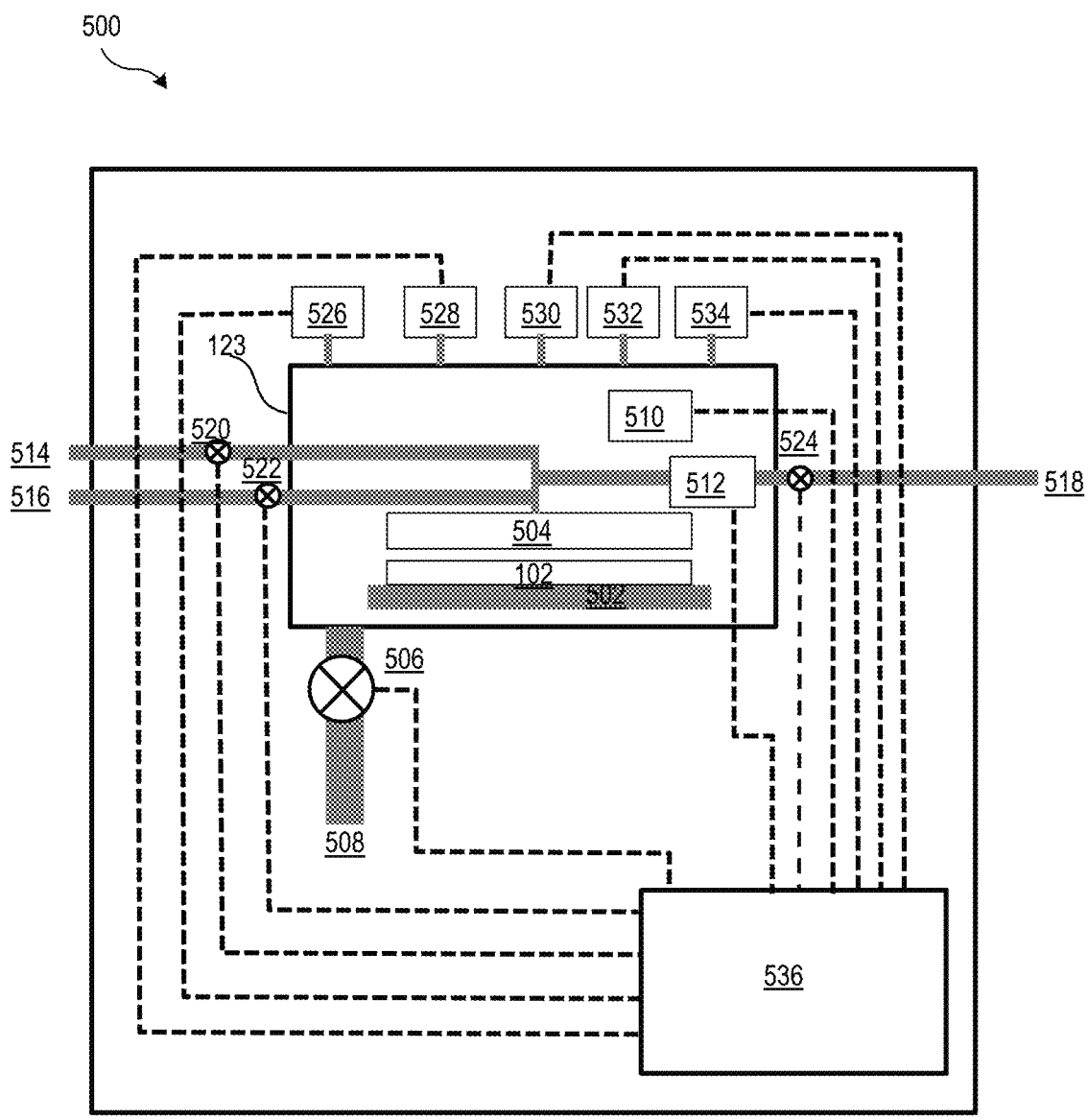
FIG. 5 illustrates a block diagram of an example plasma tool, according to certain embodiments of this disclosure.

FIG. 5 illustrates a block diagram of an example plasma tool 500, according to certain embodiments of this disclosure. Although a particular plasma tool 500 is illustrated and described, any suitable type of plasma tool may be used. Plasma tool 500 may be used to execute plasma process 120 described with respect to FIGS. 1A-1D and 2-4.

Plasma tool 500 includes plasma chamber 123 in which a semiconductor substrate (e.g., substrate 102) is processed using a plasma (e.g., plasma 122). Plasma chamber 123 includes a substrate table 502 configured to support substrate 102 during processing. In certain embodiments, substrate 102 is positioned on substrate table 502 in the condition shown in FIG. 1B, following removal of barrier layer 114 for example, for performing plasma step 120 using plasma 122. The material of Si layers 108 (described above, for example, with reference to FIGS. 1A-1D) of film stack 104 of substrate 102 is selectively etched within plasma chamber 123 by injecting the plasma (e.g., plasma 122) through a shower head 504 of plasma tool 500. Shower head 504 may include a single mixed reaction cavity that is filled with the precursor gases, mixing gases, and carrier gases that mix to form plasma 122 and a set of exit holes for dispensing plasma 122 toward substrate 102.

Plasma chamber 123 includes and/or is otherwise coupled to a vacuum pump 506 coupled to a vacuum line 508 to purge residual precursor gases from plasma chamber 123 and also may include and/or otherwise be coupled to a pressure system to maintain a target pressure in certain embodiments. Plasma chamber 123 may further include machine tools such as a heater 510 and temperature sensor 512 used to heat substrate 102 and control the temperature within plasma chamber 123 and/or of substrate 102.

Plasma tool 500 includes a precursor gas line 514, a mixture gas line 516, and a carrier gas line 518 coupled to shower head 504. In certain embodiments, the precursor gas fed through precursor gas line 514 may include a fluorine-based precursor, such as fluorine or $NF_3$, the mixture gas fed through mixture gas line 516 may include hydrogen, and the carrier gas fed through carrier gas line 518 may include nitrogen or an inert gas such as argon or krypton.

In certain embodiments, plasma tool 50o may include a system of mass flow controllers and sensors for control of gas flow (e.g., mass flow rate). Accordingly, plasma tool 500 may include a first flow controller 520, a second flow controller 522, a third flow controller 524, vacuum pump 506, heater 510, temperature sensor 512, voltage-current (V-I) sensor 526, and substrate sensors 528, 530, 532, and 534 (528-534). Precursor gas line 514, mixture gas line 516, and carrier gas line 518 are coupled to and controlled by first flow controller 520, second flow controller 522, and third flow controller 524, respectively.

Plasma tool 50o may include a controller 536 to control aspects of plasma step 120. Controller 536 may be implemented in any suitable manner. For example, controller 536 may be a computer. As another example, controller 536 may include one or more programmable ICs programmed to provide functionality described herein. In a particular example, one or more processors (e.g., microprocessor, microcontroller, central processing unit, etc.), programmable logic devices (e.g., complex programmable logic device), field programmable gate array, etc.), and/or other programmable ICs are programmed with software or other programming instructions to implement functionality described herein for controller 536. The software or other programming instructions can be stored in one or more non-transitory computer-readable mediums (e.g., memory storage devices, flash memory, dynamic random access memory, reprogrammable storage devices, hard drives, floppy disks, DVDs, CD-ROMs, etc.), and the software or other programming instructions when executed by the programmable ICs cause the programmable ICs to perform operations described herein.

Machine components such as heater 510 and temperature sensor 512 of plasma chamber 123 as well as flow controllers 520, 522, and 524, vacuum pump 506, and other components external to plasma chamber 123 are coupled to and controlled by controller 536.

Equipment sensors measure equipment parameters such as the temperature of substrate table 502, heater currents, vacuum pump speed and temperature, and provide signals to ensure the equipment is operating properly. Various process sensors measure process parameters such as process temperature, process pressure, plasma density, gas flow rates, and gas composition, and provide signals to ensure the process is operating properly. The data from the equipment and process sensors provide feedback to controller 536 continuously throughout plasma step 120. Controller 536 can make adjustments in real time to keep the equipment and process close to center of specifications.

Controller 536 receives data from the sensor(s) and controls process parameters of plasma chamber 123 based on the sensor data. Controller 536 may analyze the data collected by the sensor(s), determine when to modify or end one or more steps of plasma step 120, and provide feedback to control process parameters of components of plasma chamber 123.

Controller 536 may be connected to V-I sensor 526, and substrate sensors 528-534 to monitor plasma 122 as substrate 102 is exposed to plasma 122 to provide conditions of plasma 122 as well as optionally composition and thickness data in real time. This feedback data can be used by controller 536 to continuously adjust plasma step 120 as substrate 102 is selectively etched using plasma 122 and, for example, to turn off plasma step 120 when the target indent (e.g., etched width 144) is reached.

Specifically, measurement data from substrate sensors 528-534, and temperature sensor 512 may be received by controller 536 while controller 536 generates control signals sent to first flow controller 520, second flow controller 522, third flow controller 524, vacuum pump 506, and heater 510.

Controller 536 may receive measurement or metrology data from substrate sensors 528-534 taken at multiple points across substrate 102 to measure process uniformity and the thickness and composition of passivation layer 124 (formed from exposure of substrate 102 to plasma 122), exposed end separation 142, and/or the target indent (e.g., etch width 144) in situ and in real time. For example, multiple across substrate sensors in a multi-substrate plasma tool can be used to monitor and tune the thickness and composition of passivation layer 124 (formed from exposure of substrate 102 to plasma 122), exposed end separation 142, and/or the target indent (e.g., etch width 144) from the top to the bottom of the substrate 102. Multiple across substrate sensors in a single substrate plasma tool can be used to monitor and tune the thickness and composition of passivation layer 124 (formed from exposure of substrate 102 to plasma 122), exposed end separation 142, and/or the target indent (e.g., etch width 144) from the center of the substrate 102 to the edge of the substrate 102.

Substrate sensors 528-534 may be coupled to and/or located within plasma chamber 123 for monitoring various parameters of substrate 102, plasma tool 500 and/or plasma step 120. Substrate sensors 528-534 may include various types of sensors including, but not limited to, optical sensors (such as cameras, lasers, light, reflectometer, spectrometers, ellipsometric, etc.), capacitive sensors, ultrasonic sensors, gas sensors, or other sensors that may monitor a condition of substrate 102, plasma 122, and/or plasma tool 500. In certain embodiments, one or more optical sensors may be used to measure in real time (during plasma step 120) the thickness and refractive index of the material at surfaces 118 of Ge-containing layers and surfaces of base layer 106 (e.g., where passivation layer 124 is being formed), exposed end separation 142, and/or an etched width 144a (or another suitable measurement). As another example, a spectrometer may be used to measure in real time (during plasma step 120) a film thickness of the material at surfaces 118 of Ge-containing layers and surfaces of base layer 106 (e.g., where passivation layer 124 is being formed), exposed end separation 142, and/or an etched width 144a (or another suitable measurement). In yet another embodiment, a residual gas analyzer (RGA) may be used to detect in real time (during plasma step 120) precursor breakdown for real-time chemical reaction completion detection.

Controller 536 may receive user-input process parameters, including, for example, etch rate, conformality, profile, and deposition rate (e.g., of passivation layer 124) based on standard plasma etch parameters such as chamber pressure, chamber temperature, RF source power, RF bias power, RF waveform (e.g., continuous wave RF, pulsed RF, square pulse, sawtooth pulse, and the like), etch time, and the composition and flow rates of various process and carrier gases. Advantageously, allowing a user to tune plasma 122 to meet a target local critical dimension uniformity (LCDU).

Based on data from substrate sensors 528-534 and the user inputted process parameters, controller 536 generates control signals to temperature sensor 512 and heater 510 to adjust the heat within plasma chamber 123. As heater 510 heats plasma chamber 123, controller 536 constantly or periodically monitors temperature sensor 512 to track the temperature of plasma chamber 123 to send control signals to heater 510 to maintain the temperature in plasma chamber 123.

Once controller 536 determines, based on data provided by temperature sensor 512, that the target temperature of plasma chamber 123 has been reached, controller 536 generates control signals and data signals to activate first flow controller 520, second flow controller 522, and third flow controller 524 and provide, based on the user-input process parameters, target flow rates of the precursor gas to first flow controller 520, a target flow rate of the mixing gas to second flow controller 522, and a target flow rate of the carrier gas to third flow controller 524. Once controller 536 determines that the corresponding flow rates are established, controller 536 provides power to plasma chamber 123 to power plasma 122 through bias and source electrodes. Based on the measurements from V-I sensor 526, the power being supplied to the bias and source electrodes may be adjusted. First flow controller 520, second flow controller 522, and third flow controller 524 each may be a closed loop control system connected to a flow rate sensor and an adjustable proportional valve that allows each flow controller to constantly or periodically monitor and internally maintain the target flow rates of each gas via the flow rate sensor and the adjustable proportional valve.

In certain embodiments, once controller 536 determines, based on the user inputted data, that the etch process time has been met, controller 536 generates control signals to deactivate first flow controller 520, second flow controller 522, and third flow controller 524, which may be deactivated at the same or different times, as may be appropriate.

Controller 536 may use or analyze substrate sensor data to determine when to end plasma step 120. For example, controller 536 may receive data from a residual gas analyzer to detect an endpoint of plasma step 120. In another example, controller 536 may use spectroscopic ellipsometry to detect an average film thickness of passivation layer 124, exposed ends 141 of Ge-containing layers 110, and/or exposed end separation 142 during plasma step 120 and indicate changes during plasma step 120. In another example, controller 536 may use spectroscopic ellipsometry to detect the refractive index of the material at surfaces 118 of Ge-containing layers and surfaces of base layer 106 (e.g., where passivation layer 124 is being formed) during plasma step 120 and indicate film composition change during plasma step 120. Controller 536 may automatically end plasma step 120 when an exposed end separation 142 and/or an etched width 144a (or another suitable measurement)

objective is achieved. In certain embodiments, controller 536 may automatically adjust one or more parameters such as the ratio of $NF_3$ to $H_2$ and/or the ratio of $NF_3$ to $N_2$, for example, during plasma step 120 to achieve the desired etch profile of film stack 104. Controller 536 and the data from substrate sensors 528-534 also may be used to achieve a desired semiconductor substrate throughput objective. Further, controller 536 and the data from substrate sensors 528-534 may be used to achieve a desired etch profile of film stack 104 and composition along with a desired semiconductor substrate throughput or alternatively target a combination.

Although described for a particular application of forming nanowires/nanosheets for GAA devices, this disclosure may be used in any type of isotropic etch of Si that is selective to Ge-containing layers. Furthermore, although the etch being performed is primarily described as being for forming indents in film stack 104 by removing portions of opposing ends of Si layers 108, processes 100 and 400 may be used to remove substantially all portions of Si layers 108, which may be referred to as releasing Ge-containing layers 110.

Although this disclosure describes particular process/method steps as occurring in a particular order, this disclosure contemplates the process steps occurring in any suitable order. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method for processing a semiconductor substrate, the method comprising:
   receiving a semiconductor substrate that comprises a film stack, the film stack comprising a first germanium-containing layer, a second germanium-containing layer, and a first silicon layer positioned between the first germanium-containing layer and the second germanium-containing layer; and
   selectively etching the first silicon layer by exposing the film stack to a plasma comprising fluorine agents and nitrogen agents, the plasma etching the first silicon layer while also causing a passivation layer to be formed on exposed surfaces of the first germanium-containing layer and the second germanium-containing layer to inhibit etching of the first germanium-containing layer and the second germanium-containing layer during exposure of the film stack to the plasma.

2. The method of claim 1, wherein the plasma further comprises hydrogen agents.

3. The method of claim 1, wherein the plasma is generated from gases comprising nitrogen trifluoride ($NF_3$) gas, the fluorine agents comprising fluorine disassociated from the $NF_3$ gas.

4. The method of claim 1, wherein the plasma is generated from gases comprising $N_2$ gas, the nitrogen agents being nitrogen.

5. The method of claim 1, wherein the plasma is generated from a gas combination comprising:
   nitrogen trifluoride ($NF_3$) and ammonia ($NH_3$);
   $NF_3$, $NH_3$, and nitrogen ($N_2$);
   $NF_3$, $NH_3$, and argon (Ar);
   $NF_3$ and hydrogen ($H_2$);
   $NF_3$, $H_2$, and $N_2$; or
   $NF_3$, $H_2$, $NH_3$, and $N_2$.

6. The method of claim 1, wherein the passivation layer formed on the exposed surfaces of the first germanium-containing layer and the second germanium-containing layer comprises germanium nitride ($Ge_3N_4$).

7. The method of claim 1, wherein the first germanium-containing layer and the second germanium-containing layer are both germanium layers or are both silicon-germanium layers.

8. The method of claim 1, wherein one of the first germanium-containing layer and the second germanium-containing layer is a germanium layer and the other of the first germanium-containing layer and the second germanium-containing layer is a silicon-germanium layer.

9. The method of claim 1, wherein selectively etching the first silicon layer comprises selectively etching an end portion of the first silicon layer to form an indent in the film stack between the first germanium-containing layer and the second germanium-containing layer.

10. The method of claim 1, wherein, as the first silicon layer is selectively etched, additional surfaces of the first germanium-containing layer and the second germanium-containing layer are exposed, the plasma forming the passivation layer on the additional surfaces.

11. The method of claim 1, wherein selectively etching the first silicon layer comprises selectively removing substantially all of the first silicon layer between the first germanium-containing layer and the second germanium-containing layer.

12. The method of claim 1, wherein, prior to selectively etching the first silicon layer:
   a native oxide layer is present on a surface of the film stack; and
   the method further comprises etching the native oxide layer.

13. The method of claim 1, wherein:
   the film stack further comprises a second silicon layer and a third germanium-containing layer, the second silicon layer positioned between the second germanium-containing layer and the third germanium-containing layer; and
   the method comprises selectively etching the second silicon layer by exposing the film stack to the plasma, the plasma forming the passivation layer on exposed surfaces of the third germanium-containing layer to inhibit etching of the third germanium-containing layer during exposure of the film stack to the plasma.

14. A method for processing a semiconductor substrate, the method comprising:
   positioning a semiconductor substrate in a plasma chamber of a plasma tool, the semiconductor substrate comprising a film stack that comprises silicon layers and germanium-containing layers in an alternating stacked arrangement, with at least two silicon layers and at least two germanium-containing layers;
   generating, in the plasma chamber of the plasma tool, a plasma that comprises fluorine agents, nitrogen agents, and hydrogen agents, the plasma generated without a deliberate introduction of oxygen-containing gas into the plasma chamber; and
   exposing, in the plasma chamber of the plasma tool, the film stack to the plasma, the plasma causing a nitride passivation layer to be formed on exposed surfaces of the germanium-containing layers while also selectively etching opposing exposed ends of the silicon layers to form indents in the silicon layers relative to opposing exposed ends of the germanium-containing layers, the nitride passivation layer inhibiting etching of the germanium-containing layers by the plasma.

15. The method of claim 14, wherein:
the plasma is generated from gases comprising a fluorine-containing gas, the fluorine-containing gas comprising nitrogen trifluoride ($NF_3$), sulfur hexafluoride ($SF_6$), or carbon tetrafluoride ($CF_4$); and
the fluorine agents comprise fluorine disassociated from the fluorine-containing gas.

16. The method of claim 14, wherein:
the plasma is generated from gases comprising a nitrogen-containing gas, the nitrogen-containing gas comprising $N_2$, $NF_3$, or $NH_3$; and
the nitrogen agents comprise nitrogen disassociated from the nitrogen-containing gas.

17. The method of claim 14, wherein:
the plasma is generated from gases comprising nitrogen ($N_2$) gas and hydrogen ($H_2$) gas;
the nitrogen agents comprise nitrogen; and
the hydrogen agents comprise hydrogen.

18. The method of claim 14, wherein the plasma is generated from a gas combination comprising:
nitrogen trifluoride ($NF_3$) and ammonia ($NH_3$);
$NF_3$, $NH_3$, and nitrogen ($N_2$);
$NF_3$, $NH_3$, and argon (Ar);
$NF_3$ and hydrogen ($H_2$);
$NF_3$, $H_2$, and $N_2$; or
$NF_3$, $H_2$, $NH_3$, and $N_2$.

19. The method of claim 14, wherein the nitride passivation layer formed on the exposed surfaces of the germanium-containing layers comprises germanium nitride ($Ge_3N_4$).

20. A method for processing a semiconductor substrate, the method comprising:
positioning a semiconductor substrate in a plasma chamber of a plasma tool, the semiconductor substrate comprising a film stack that comprises first layers of a first material and second layers of a second material in an alternating stacked arrangement, the first material being silicon;
generating a plasma for selectively etching the first layers of the first material, generating the plasma comprising introducing gases including fluorine and nitrogen into the plasma chamber and maintaining a temperature on the semiconductor substrate of approximately $-40°$ C. to approximately $40°$ C., wherein the plasma includes a greater amount of nitrogen than fluorine; and
exposing, in the plasma chamber, the film stack to the plasma for a time period, the plasma selectively etching opposing exposed ends of the first layers of the first material to form indents in the first layers of the first material relative to opposing exposed ends of the second layers of the second material.

* * * * *